United States Patent [19]

Schrenk

[11] Patent Number: 4,755,970

[45] Date of Patent: Jul. 5, 1988

[54] METHOD AND APPARATUS FOR FUNCTIONAL TESTING OF A MEMORY WHICH IS REPROGRAMMABLE ELECTRICALLY WORD BY WORD

[75] Inventor: Hartmut Schrenk, Haar, Fed. Rep. of Germany

[73] Assignee: Siemens Aktiengesellschaft, Berlin and Munich, Fed. Rep. of Germany

[21] Appl. No.: 814,620

[22] Filed: Dec. 30, 1985

Related U.S. Application Data

[63] Continuation-in-part of Ser. No. 465,532, Feb. 10, 1983, abandoned.

[30] Foreign Application Priority Data

Feb. 16, 1982 [DE] Fed. Rep. of Germany ....... 3205473

[51] Int. Cl.[4] .............................................. G11C 7/00
[52] U.S. Cl. .................................................. 365/201
[58] Field of Search .................. 371/21; 365/201, 218, 365/189, 230

[56] References Cited

U.S. PATENT DOCUMENTS 4,087,795  5/1978  Rossler ................................. 365/185
4,279,024  7/1981  Schrenk ............................... 365/203

OTHER PUBLICATIONS

W. S. Johnson et al., "16-K EE-PROM Relies on Tunneling for Byte-Erasable Program Storage", Electronics, Feb. 28, 1980, pp. 113-117.

Primary Examiner—Joseph A. Popek
Attorney, Agent, or Firm—Herbert L. Lerner; Laurence A. Greenberg

[57] ABSTRACT

Method for the functional testing of a memory being electrically programmable word by word and including storage cells having storage transistors with given reading window widths during normal operation, which includes reducing the width of the reading windows of the storage transistors during a functional test, as compared to the given width during normal operation, and an apparatus for carrying out the method.

13 Claims, 3 Drawing Sheets

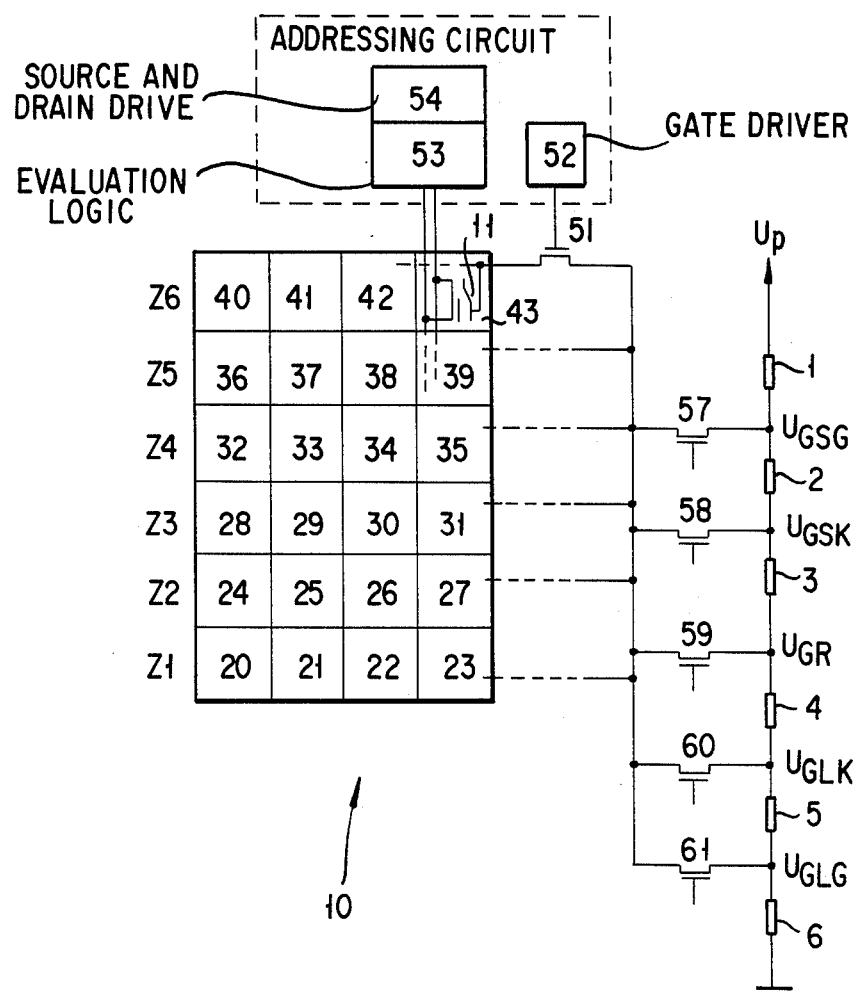

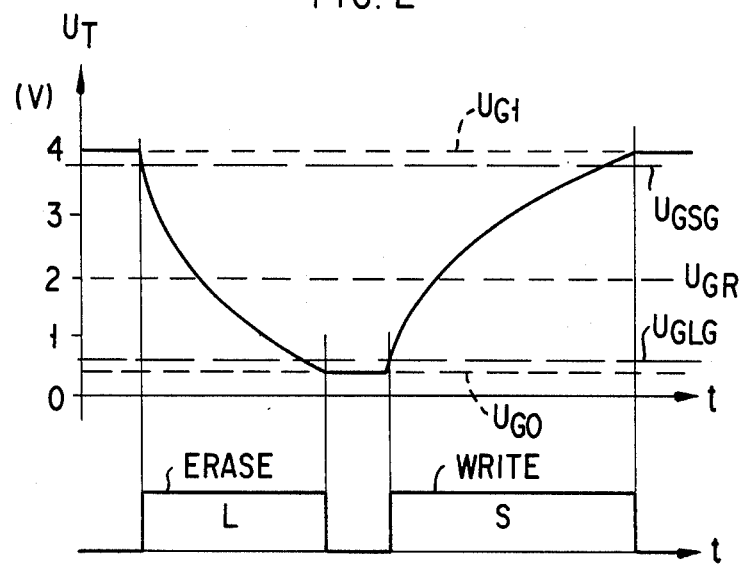
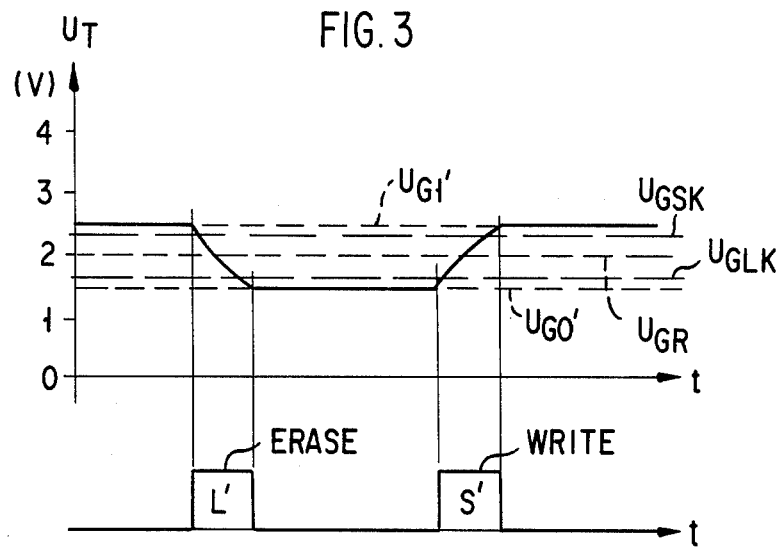

METHOD AND APPARATUS FOR FUNCTIONAL TESTING OF A MEMORY WHICH IS REPROGRAMMABLE ELECTRICALLY WORD BY WORD

This is a Continuation-In-Part of application Ser. No. 465,532, filed Feb. 10, 1983, now abandoned.

The invention relates to a method for the functional testing of a memory which is electrically reprogrammable word by word including storage cells having storage transistors, as well as to an apparatus for carrying out the method.

Memories of this type are generally called EEPROMs (Electrically Erasable Programmable Read-Only Memories) and can be constructed in a manner known from U.S. Pat. No. 4,087,795, being incorporated hereinto by reference or from the publication Electronics, Feb. 28, 1980, Pages 113 to 117, for instance, in floating gate technology or as retention memories such as so-called MNOS memories also being incorporated hereinto by reference.

These memories have the disadvantage of requiring a relatively long reprogramming time which, depending on the type of memory, is between 1 ms and 1 s per stored word. This disadvantage manifests itself particularly in testing the EEPROM memories, if the memory addresses must be sequentially erased and written for checking the operation of all memory bits. For instance, a 16-k bit EEPROM with 8-bit organization theoretically requires 40 seconds for testing all 2000 addresses with 10 ms erasing time and 10 ms writing time per address. Taking the cost of modern automatic testers into consideration, this testing time is intolerable. There are various possibilities for reducing the testing time and thereby the testing costs, all of which, however, have disadvantages. Thus, the old information written into a memory can be erased simultaneously for all memory addresses. Therefore, a mode of operation for total erasure of the memory is built into many EEPROMs, whereby the erasing time hardly remains significant. Analog simultaneous total writing of an EEPROM with a predetermined testing pattern, however, is not directly possible. In a floating-gate memory, which is written with channel injection, this is impossible, for instance, for reasons of current drain and dissipation loss. In an EEPROM which is operated by means of the tunnel effect, i. e. without significant flow of current, the joint writing is possible in principle, but requires deep intervention into the decoder and addressing logic of the memory. Furthermore, faulty programming behavior of individual addresses is not checked.

In the worded state, the tests can be simultaneously carried out word by word on a larger number of units, and testing time can be saved in this manner. However, for practical reasons this method is not feasible for the testing of memories which are still in the semi-conductor wafer condition, because then the individual memory system can only be contacted by measuring prods so that one is limited in many cases to partial measurements and statistical statements.

It is accordingly an object of the invention to provide a method and apparatus for the functional testing of a memory which is reprogrammable electrically word by word, which overcomes the herein-afore-mentioned disadvantages of the heretofore-known methods and devices of this general type, and to provide for the functional testing of EEPROMs in which the time required for the functional testing is reduced considerably.

With the foregoing and other objects in view there is provided, in accordance with the invention, a method for the functional testing of a memory being electrically programmable word by word and including storage cells having storage transistors with given reading window widths during normal operation, which comprises reducing the width of the reading windows of the storage transistors during a functional test, as compared to the given width during normal operation.

In reprogramming of an EEPROM in normal operation, the threshold voltage of the transistors of the storage cells is commonly shifted for erasing and writing in the negative or positive direction to such a degree that between the erased and the written state, under all tolerance variations of production, voltage supply or product aging, a reading window of sufficient width with a safety margin relative to the predetermined reading voltage is produced. In this context the reading window is understood to mean the voltage range between the cutoff voltage of a storage transistor in the erased state and the cutoff voltage of a storage transistor in the written state. Reading voltage is understood to mean the voltage to be applied to the gate of the storage transistor for reading. According to the invention, the reading window is decreased in test operation, dispensing with the margin of safety against data losses, and in this manner, testing time is saved.

In accordance with another mode of the invention, there is provided a method which comprises reducing the width of the reading windows by at least 50% and especially 80% as compared to the given width.

A danger which exists if the reading window is reduced and the reading voltage is fixed, is that the reading voltage will no longer be in the window interval and individual storage cells will therefore be indicated as defective although they would meet specifications under standard conditions. To avoid this danger, in accordance with a further mode of the invention, there is provided a method which comprises reducing the width of the reading windows through a time control of an erasing and writing cycle.

In accordance with an added mode of the invention, there is provided a method in a memory having an addressing circuit for erasing and writing the storage cells, which comprises operating the addressing circuit with different erase and writing time, and fixing an end of the erase and writing time by controlling the successful attainment of at least one of (a) a predetermined erase or (b) a predetermined write state of at least one storage cell of the memory.

In accordance with an additional mode of the invention, there is provided a method which comprises fixing the attainment of the predetermined erase state by comparing a threshold voltage of a storage transistor with a predetermined erase test voltage.

In accordance with again another mode of the invention, there is provided a method which comprises determining the attainment of the predetermined write state by comparing a threshold voltage of a storage transistor with a predetermined write test voltage.

In accordance with again a further mode of the invention, there is provided a method which comprises adjusting the reduction of the read window during the functional test by changing control voltages being applied to a control gate of the storage or control transistors. This can be achieved by means of a circuit configuration for the time control of the erase and writing cycle which is integrated on the memory chip; however, it is also possible to switch the internal gate voltage of the storage transistors in a defined manner by means of an integrated auxiliary circuit disposed on the memory chip. It is of advantage in this case to change the voltage at the control gate of the storage transistors by a connecting pad.

The erase and write control voltages are advantageously generated together with the readout voltage by means of a common voltage divider and controlled by changing a single high voltage.

In accordance with again an added mode of the invention, there is provided a method which comprises shifting a threshold voltage of the storage transistors simultaneously in one direction for all storage addresses and successively in the other direction, when reprogramming.

In accordance with again an additional mode of the invention, there is provided a method which comprises carrying out the shifting step word by word.

In accordance with yet another mode of the invention, there is provided a method which comprises simultaneously shifting the threshold voltage of the storage transistors for all storage addresses, when reprogramming.

In accordance with yet a further mode of the invention, there is provided a method which comprises serially shifting the threshold voltage of the storage transistors by word for erasing and writing.

In accordance with a concomitant feature of the invention, there is provided an apparatus for functionally testing a memory being electrically reprogrammable word by word, comprising storage cells being disposed in rows, each storage cell having a storage transistor, and an addressing circuit connected to the storage transistors for erasing and writing with a respective erasing or writing time being variable for each of the storage cells and for determining an end of the erase or writing time by checking the attainment of a predetermined erase or writing state of at least one of the storage cells of a row of storage cells to be erased or written.

Other features which are considered as characteristic for the invention are set forth in the appended claims Although the invention is illustrated and described herein as embodied in a method and apparatus for the functional testing of a memory which is reprogrammable electrically word by word, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 1 is a diagrammatic and schematic view of a portion of the circuit diagram of an embodiment example for carrying out the method according to the invention;

FIG. 2 is a graphical illustration of the waveform of the threshold voltage of a storage transistor as well as the erase and writing time for a wide reading window; and FIG. 3 is a view similar to FIG. 2 of the waveform of the threshold voltage of a storage transistor as well as the erase and writing time for a narrow reading window.

Figure 4:
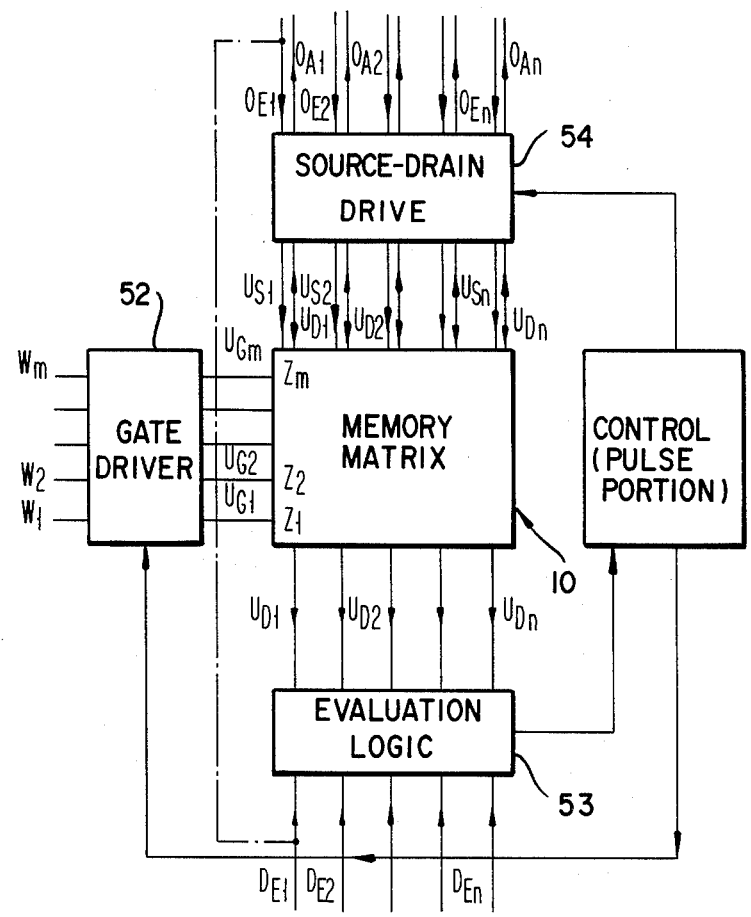
FIG. 4 shows the addressing arrangement for addressing the memory cells of a memory matrix.

Referring now in detail to the figures of the drawing in which like elements are provided with the same reference symbols, and first, particularly to FIG. 1 thereof, there is seen a nonvolatile reprogrammable memory (EEPROM) 10 and a control and checking logic, only portions of which are shown for reasons of clarity. In the case shown, the EEPROM 10 is formed of 24 storage cells bearing reference numerals 20 to 43, which are disposed in the form of a matrix, each having a storage transistor 11. In the EEPROM 10 four storage cells and therefore four bits always form a memory row. This embodiment example for the EEPROM 10 was chosen for reasons of clarity. The method according to the invention, however, is particularly suitable for memories with larger bit numbers, for instance 16-k bit EEPROMs. In FIG. 1, only one storage transistor is shown also for reasons of clarity. A storage cell may also be formed of a storage transistor 11 and a selection transistor, which is not shown in FIG. 1 for reasons of better clarity, as is known from the publication Electronics, Feb. 28, 1980, Pages 113 to 117.

According to the invention, the storage transistors 11 of the storage cells of the memory 10 have smaller reading windows during the functional test of the memory 10 than in normal operation. In this context "reading window" is understood to mean the (absolute value) difference of the cutoff voltage of a storage transistor 11 in the programmed state and the cutoff voltage in the unprogrammed state.

The width of the reading windows of the storage transistor of cells 20 to 43 can be reduced and tested during the functional testing, such as through a programming time control shown in detail in U.S. Pat. No. 4,279,024, incorporated hereinto by reference, so that during the testing, the reading window is not only made narrower but the reprogramming of the storage cells is also controlled in such a manner that the reading window reliably encloses the reading voltage. The timing control described in the above-cited publication operates in such a manner that an addressing circuit is connected to the memory matrix 10, and for each memory row $Z_1$ to $Z_6$, variable erase and writing times are provided. The end of such times is indicated by the attainment of a predetermined erase or writing state of one or more storage cells of the memory row to be erased or written. The erase or write state of one or more storage cells of the memory row to be erased or written is tested during the erase or writing time of this memory row.

FIG. 4 shows a memory addressing arrangement consisting of the gate driver 52 connected to the memory matrix 10 via the word or row addressing lines $V_{G1}$-$V_{GM}$. The gate driver 52 is in turn driven by word lines $W_1$-$W_m$, and the evaluation logic 53, receiving the individual word cell outputs $V_{D1}$-$V_{Dn}$, which are evaluated under control of the data input lines $D_{E1}$-$D_{En}$. The source and drain drive 54 of FIG. 1 is shown connected to the memory matrix 10 by the source voltage lead $U_{S1}$-$U_{Sn}$ and the drain voltage leads $U_{D1}$-$U_{Dn}$.

FIG. 4 is a copy of FIG. 1 of the referenced U.S. Pat. No. 4,279,024, but with minor modifications in order to correspond to the terminology used in the instant specification. The modifications include changing the label of the source-drain control 200 of the reference to "source-drain drive" 54, changing the gate control 500 of the reference to the "gate driver" 52, changing the reference numeral of the evaluation logic 400 of the reference to "53", changing the reference numeral of the memory matrix 100 of the reference to "10", and to show labels Z1, Z2—Zm in the memory matrix 10 to correspond with the labels for the matrix memory rows Z1 - Z6, shown in FIG. 1.

The addressing circuit can be connected in this case to the memory matrix in such a manner that, in order to obtain a variable erase time of a storage cell and for checking the erase state of one or more storage cells of the row to be erased the erase voltage present at the storage cells are divided into a time series of individual pulses. In this way a test reading process is always inserted in the pulse pauses. Under some circumstances, simultaneous erasing and test reading can also be performed.

The addressing circuit is furthermore connected to the memory matrix according to the above referenced U. S. Pat. No. 4,279,024 in such a manner that the erase time of a memory row is completed if all storage cells which are test-read, have a threshold voltage of $U_T$, where $U_T$ is smaller than the equal to $U_{GL}$, and $U_{GL}$ stands for a specified threshold value of the storage cells used.

The same situation applies for the addressing circuit for obtaining a variable write time. The circuit is therefore constructed in such a way that the write time of a memory row is completed if all storage cells which are test-read, have a threshold voltage $U_T$ larger than or equal to $U_{GS}$, where $U_{GS}$ is a predeterminable write test voltage.

In order to ensure a safe minimum margin between the gate voltag $U_{GR}$ which is required for reading and must be applied to the gate of the storage transistor 11, the gate voltages which are required as predetermined threshold values ($U_{GS}$ and $U_{GL}$) for test reading in programming and erasing, as well as the gate voltages for reading-out the storage cells ($U_{GR}$) are advantageously taken from one and the same voltage divider. In this way, $U_{GL}$ is always smaller than $U_{GR}$ and at the same time $U_{GR}$ is smaller than $U_{GS}$.

With respect to further details and, in particular, the actual circuitry of the source-drain addressing circuits, the evaluation logic, the gate-driver circuit and the control circuit with the pulse part, which are not shown in FIG. 1 for reasons of clarity, reference is made to the detailed disclosure in the referenced U.S. Pat. No. 4,279,024.

The programmed timing control is carried out in such a way that when testing during the reprogramming cycle, the respective position of the cutoff voltage (threshold voltage) $U_T$ of a storage transistor 11 is compared with a predetermined test reading voltage $U_{GLK}$ or a predetermined test write voltage $U_{GSK}$, as shown in the upper part of FIG. 3. If the threshold voltage $U_T$ is above the threshold voltage in the programmed state $U_{GI}'$, the storage transistor 11 is reliably cut off in the case of n-channel MOS-technology. For $U_T < U_{GO}'$ (where $U_{GO}'$ is the cutoff voltage in the unprogrammed state) the storage cell is placed in the conducting state with certainty. From the change between the conducting and cutoff state, it can therefore be seen whether or not the storage cell has reached a desired programming state under given test conditions. By fixing the test voltages $U_{GSK}$ and $U_{GLK}$, the voltages $U_{GI}'$ and $U_{GO}'$ and therefore the width of the reading window are thereby fixed relative to the read voltage $U_{GR}$. Thus, the respective cutoff voltages of the storage cell for erasing and writing can be adjusted in a defined manner. The required erasing times L' and writing times S' are shown in the lower part of FIG. 3.

During the testing and during the functional check, a narrow reading window which in the case of a floating gate memory amounts to a few tenths of a volt, is now chosen, according to the invention, in view of the testing time. In other words, the reading window in FIG. 3 ($U_{GI}' - U_{GO}'$) is a few tenths of a volt. For normal operation, a wider reading window with a larger margin of safety against the predetermined reading voltage is chosen in view of the tolerance variations in production, the voltage supply or product aging, as shown, for instance, in FIG. 2.

The test method according to the invention is particularly easy to apply if the memory 10 also operates with programming time control in normal operation and the evaluation limits for reaching an erase or writing state need only be shifted in the direction toward the read voltage for testing. Such a wider reading window ($U_{GI} - U_{GO}$) is obtained, according to FIG. 2, through the choice of the write testing voltage $U_{GSG}$ and the read testing voltage $U_{GLG}$. In this case, the test voltages are chosen as being further away from the read voltage $U_{GR}$, as compared to the test voltages with a small reading window (testing operation) $U_{GSK}$ and $U_{GLK}$. With the larger read window, the erase time L and the writing time S are increased, as shown at the bottom of FIG. 2, but the data safety is improved considerably.

The illustration in FIGS. 2 and 3 relates to the use of n-channel MOS-floating-gate storage transistors which are programmable by means of channel injection, which is also the basis of the embodiment example in the referenced U.S. Pat. No 4,279,024. If n-channel transistors are used as is described, for instance in the publication Electronics, Feb. 28, 1980, Pages 113 to 117, the threshold voltage $U_{GI}$ is characterized by the erased state and the threshold voltage $U_{GO}$ is characterized by the written state.

Through the timing control, a shortening of the programming time as compared to the case of fixed erasing and writing times is already obtained on the average, in normal operation. Reduction of the reading window in test operation to 10% of the window width in normal operation, for instance, additionally shortens the programming times in testing to less than 10 of the normal values because of the asymptotic course of the threshold voltages versus the erase and writing time. This may, for instance, be from 10 ms to 1 ms per row Z1–Z6 or per word.

If programming time control is used, the read test voltages and the write test voltages and the read voltage $U_{GR}$ are advantageously generated by a common voltage divider, which determines the sequence of the voltages in an unchanged manner. This applies particularly to the use of a programming time control for normal as well as for testing operation. A corresponding voltage divider which is formed of resistors 1, 2, 3, 4, 5 and 6 connected in series, is shown in FIG. 1. The lead of the resistor 1 which is not connected to the resistor 2, is connected to a supply voltage $U_P$ which is larger than the voltage $U_{GSG}$. The lead of the resistor 6 which is not connected to the resistor 5 is grounded. Between the resistors 1 and 2, the testing write voltage $U_{GSG}$ for generating a large reading window (normal operation)

then appears; between the resistors 2 and 3, the write test voltage ($U_{GSK}$) for generating a small reading window (testing operation) appears; between the resistors 3 and 4, the read voltage $U_{GR}$ proper appears; between the resistors 4 and 5 the read testing voltage $U_{GLK}$ for generating a small reading window (testing operation) appears; and between the resistors 5 and 6, the read testing voltage $U_{GLG}$ for generating a wide reading window (normal operation) appears.

The testing voltages $U_{GSG}$ and $U_{GLG}$ and the read voltages $U_{GR}$ can then act through transfer gates 57, 61, 59, respectively, and a further transfer gate 51 which can be controlled by the row decoder of a gate driver circuit 52. The testing and read voltages act during normal operation on the gate of a storage transistor 11, which is then to have a wide reading window. During the testing operation, the gate electrodes of the storage transistors then acted upon through the transfer gates 58, 60 and 59 and a further transfer gate which corresponds to the transfer gate 51 but is not shown in the figure for reasons of clarity. The electrodes of the storage transistors are acted upon by the voltages $U_{GSK}$, $U_{GLK}$ and $U_{GR}$, respectively, and are thus provided with narrow reading windows. The transfer gates 51, 57, 58, 59, 60 and 61 are addressed by means of the gate driver ("control") circuit 52 which can be constructed in accordance with the gate driver circuit described in the referenced U.S. Pat. No. 4,279,024.

An evaluation logic 53 which is connected to the source terminals and the drain terminals of the storage transistors 11, and a source and drain drive 54, can likewise be constructed in accordance with the evaluation logic and the source and drain drive described in the referenced U.S. Pat. No. 4,279,024. A separate evaluation logic each must be provided for test operation and normal operation.

However, the method of programming time control during the functional test according to the invention can be applied to any other EEPROM memory which does not contain the necessary control logic for time control itself. Since it is the only testing accessory within the EEPROM, a possibility must as a rule be provided for externally influencing the read-out voltage $U_{GR}$ at the control gate 11 of the storage transistors of the storage cells, i. e. for changing them in an analog manner. This can be achieved, for instance, by providing that the memory has a connecting pad which can be influenced by the voltage at the control gate. The pulse pattern of the programming and testing voltage for providing the programming time control, described in detail in the referenced U.S. Pat. No. 4,279,024, can then be subsequently performed externally during the module test by the testing logic without causing a problem.

It is also possible to provide an auxiliary circuit in integrated memory circuits which switches the internal gate voltages during testing operation in a defined manner, and thus also permits time control of the programming cycle without integrated timing control logic together with an external circuit or test equipment The configurations for obtaining reduced reading window widths during test operation can therefore be made in the memory module. However, it is also possible to provide these configurations externally and thus, for instance, to operate commercially available EEPROM memories in which the gate terminals of the storage transistors are accessible, in accordance with the invention.

In the method according to the invention, the reading window width is advantageously reduced during the functional testing of the storage cells by at least 50% and particularly by at least 80% of the window width in normal operation. Advantageously, a reduction to 5 to 50% of the window width in normal operation is possible. Furthermore, with appropriate construction of the storage cell and suitable expense for stabilization of the supply voltage, however, a reduction to less than 50% of the normal window width is also possible. The invention can be applied to EEPROMs which use floating gate storage cells, as well as with other EEPROMs which, for instance, use MMOS storage cells.

I claim:

1. Method for the functional testing of a memory being electrically programmable word by word and including storage cells having storage transistors of such given widths of the reading windows during normal operation, that the programming times remain short during the specified life of the cells, which comprises reducing first the width of the reading windows of the storage transistors during a functional test, as compared to the given width during normal operation, and determining next if the memory contents can be read correctly, and rejecting the memory if the memory contents cannot be read correctly.

2. Method according to claim 1, which comprises reducing the width of the reading windows by at least 50% as compared to the given width.

3. Method according to claim 1, which comprises reducing the width of the reading windows by at least 80% as compared to the given width.

4. Method according to claim 1, which comprises reducing the width of the reading windows through a time control of an erasing and writing cycle.

5. Method according to claim 1, wherein the memeory has an addressing circuit for addressing the storage cells and control means for determinng the limit of successfful function in at least one of a predetermined erase and write state of at least one storage cell, which comprises operating the addressing circuit with different erase and writing times, and terminating the erase and writing times when the limit of successful function in at least one of the predetermined erase and write state of said at least one storage cell of the memory is determined by said control means.

6. Method according to claim 5, which comprises determining the successful function of the predetermined erase state by comparing a threshold voltage of a storage transistor with a predetermined erase test voltage.

7. Method according to claim 5, which comprises determining the successful function of the predetermined write state by comparing a threshold voltage of a storage transistor with a predetermined write test voltage.

8. Method according to claim 1, which comprises adjusting the reduction of the read window during the functional test by changing control voltages being applied to a control gate of the storage transistors.

9. Method according to claim 1, which comprises shifting a threshold voltage of the storage transistors simultaneously in one direction for all storage addresses and successively in the other direction, when programming.

10. Method according to claim 9, which comprises carrying out the shifting step word by word.

11. Method according to claim 9, which comprises simultaneiously shifting the threshold voltage of the storage transistors for all storage addresses, when re-programming.

12. Method according to claim 9, which comprises serially shifting the threshold voltage of the storage transistors by word for erasing and writing.

13. Apparatus for functionally testing a memory being electrically reprogrammable word by word, having storage cells being disposed in rows, each storage cell having a storage transistor, comprising an addressing circuit for addressing said storage transistors, means responsive to said addressing circuit for erasing information and writing information into the respective storage cell; means for varying the erasing or writing time for each of said storage cells; and control means for determining the limit of successful function in at least one of a predetermined erasing and writing state of at least one storage cell, and means responsive to said control means for terminating the erasing and writing times when the limit of said successful function has been determined by said control means.

* * * * *